US007118935B2

(12) United States Patent
Bar

(10) Patent No.: US 7,118,935 B2
(45) Date of Patent: Oct. 10, 2006

(54) BUMP STYLE MEMS SWITCH

(75) Inventor: Hanan Bar, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 257 days.

(21) Appl. No.: 10/403,738

(22) Filed: Mar. 31, 2003

(65) Prior Publication Data

US 2004/0188781 A1 Sep. 30, 2004

(51) Int. Cl.
*H01H 11/04* (2006.01)
*B81C 1/00* (2006.01)

(52) U.S. Cl. .................................... 438/52; 438/461

(58) Field of Classification Search .................. 438/52, 438/461, 50
See application file for complete search history.

(56) References Cited

U.S. PATENT DOCUMENTS 5,472,916 A * 12/1995 Bertagnolli et al. .......... 438/50
5,789,269 A * 8/1998 Mehta et al. ............... 438/439
5,940,711 A * 8/1999 Zambrano ................... 438/366
2002/0055260 A1 5/2002 Chow et al.
2002/0097118 A1 7/2002 Siekkinen et al.
2003/0127698 A1* 7/2003 Lee ............................ 257/415

FOREIGN PATENT DOCUMENTS

WO WO 02/073645 9/2002

* cited by examiner

*Primary Examiner*—Howard Weiss
*Assistant Examiner*—Marcos D. Pizarro-Crespo
(74) *Attorney, Agent, or Firm*—Trop, Pruner & Hu, P.C.

(57) ABSTRACT

A microelectromechanical system switch may be formed with a protrusion defined on the substrate which makes contact with a deflectable member arranged over the substrate. The deflectable member may, for example, be a cantilevered arm or a deflectable beam. The protrusion may be formed in the substrate in one embodiment using field oxide techniques.

14 Claims, 3 Drawing Sheets

BUMP STYLE MEMS SWITCH

BACKGROUND

This invention relates generally to microelectromechanical system switches.

Microelectromechanical system (MEMS) switches are mechanical switches that are fabricated using integrated circuit techniques at very small dimensions. Typically, MEMS switches use a tip configuration. The switch may consist of a cantilevered arm extending over a semiconductor substrate. Near the end of the cantilevered arm is a tip with a contact. The tip contact makes an electrical connection when the cantilevered arm is deflected towards the semiconductor substrate so as to electrically touch a contact formed on the substrate.

Other MEMS switches may use a beam instead of an arm. Here, too, a movable element over the substrate includes a protrusion that makes an electrical connection to a contact on the substrate when the beam is electrostatically deflected towards said substrate.

The manufacturing process flow for a tip-based switch may include timed etch steps. In high volume manufacturing, it is not desirable to work with timed etch processes since they may not be repeatable. The constituents that are used, such as acids, may change with time and etched layers may change from batch to batch. In high volume manufacturing, etch stop layers may be utilized to reduce the affect of timed etches. However, the use of etch stops also yields quite sensitive and complex process flows.

Thus, it would be desirable to provide a different type of MEMS switch.

DETAILED DESCRIPTION

In accordance with some embodiments of the present invention, a microelectromechanical system (MEMS) switch is formed which uses what may be called a bump configuration. In a bump configuration the protrusion is formed on the substrate and no such protrusion need be formed on the deflectable arm or beam. As used herein, the term "deflectable member" will refer to an extended beam or cantilevered arm that moves relative to the substrate to make and break an electrical contact. While the ensuing description describes a cantilevered type structure, the present invention is applicable to any MEMS switch with a deflectable member.

In some embodiments of the present invention, the use of timed etch steps may be eliminated which may improve repeatability in high volume manufacturing. However, the present invention is not necessarily limited to embodiments that preclude the use of timed etch steps.

Figure 1:
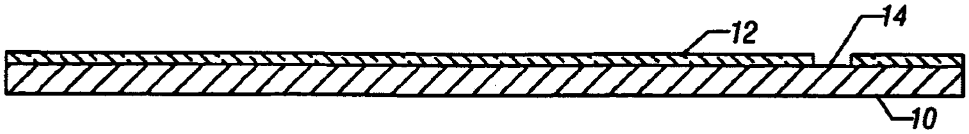
FIG. 1 is an enlarged, schematic view of one embodiment of the present invention at an early stage of manufacture.
Figure 2:
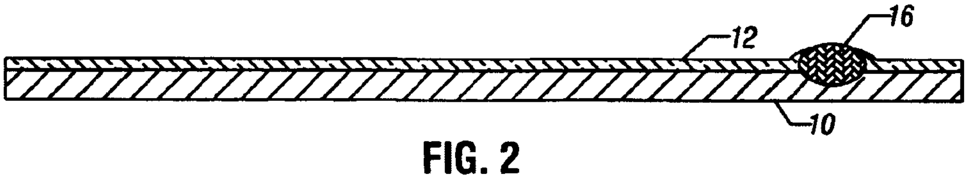
FIG. 2 is an enlarged cross-sectional view corresponding to FIG. 1 at a subsequent stage of manufacture in accordance with one embodiment of the present invention.

Referring to FIG. 1, a semiconductor substrate 10 may be covered by a layer 12, such as silicon nitride, and an opening 14 may be defined therein using conventional techniques such as patterning and etching. The structure may be exposed to a high temperature oxidation to grow the field oxide-like bump 16 shown in FIG. 2, in one embodiment.

Figure 3:
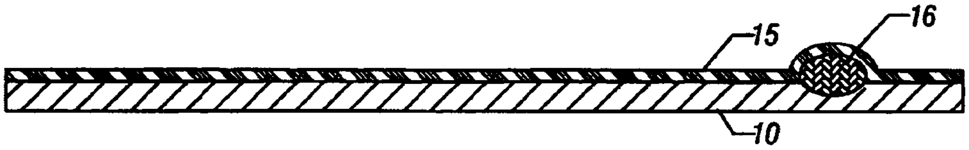
FIG. 3 is an enlarged cross-sectional view corresponding to FIG. 2 at a subsequent stage of manufacture in accordance with one embodiment of the present invention.

Referring to FIG. 3, the remaining layer 12 may be removed and a new isolation layer 15 may be formed, for example, by deposition. In one embodiment, the layer 15 may be deposited and may be an interlayer dielectric (ILD) or a medium temperature oxide (MTO), as two examples.

Figure 4:
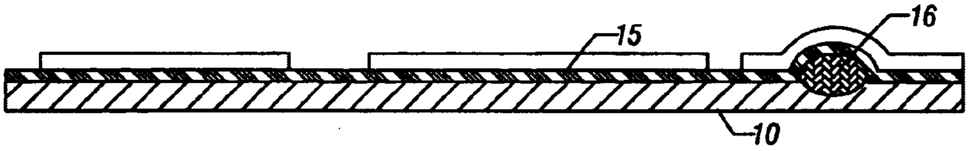
FIG. 4 is an enlarged cross-sectional view corresponding to FIG. 3 at a subsequent stage of manufacture in accordance with one embodiment of the present invention.

Referring to FIG. 4, a metal layer 18, formed over the layer 14 may be patterned and etched to define the illustrated pattern. The metal layer 18, in one embodiment, may be formed by sputtering and patterning. In some cases, the layer 18 may be formed of gold.

Figure 5:
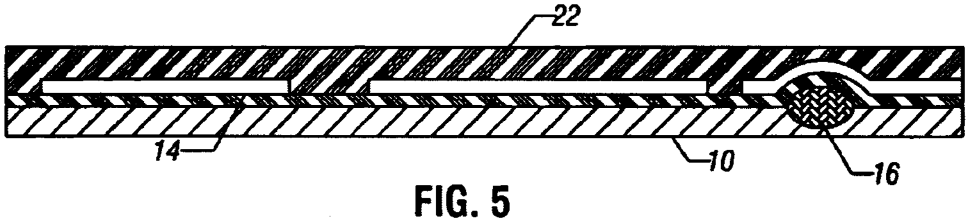
FIG. 5 is an enlarged cross-sectional view corresponding to FIG. 4 at a subsequent stage of manufacture in accordance with one embodiment of the present invention.

Referring to FIG. 5, a planarization layer 22 may be deposited. In one embodiment, the layer 22 may be photoresist and in another embodiment it may be spin-on glass. Other sacrificial materials may be used as well, including materials that are removed in response to heating. Desirably, the thickness of the layer 22 over the bump 16 is smaller than that over the layer 18.

Figure 6:
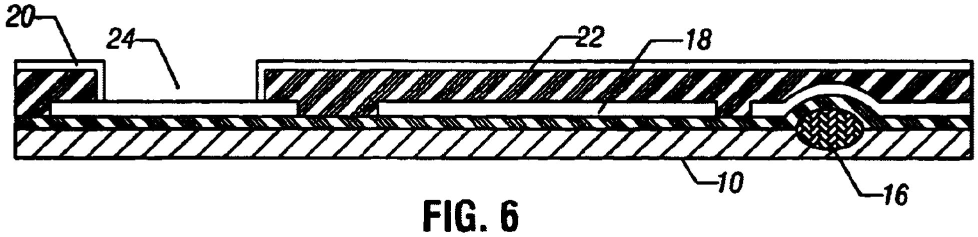
FIG. 6 is an enlarged cross-sectional view corresponding to FIG. 5 at a subsequent stage of manufacture in accordance with one embodiment of the present invention.

Referring to FIG. 6, an opening 24 may be formed through the layer 22 using masking and etch steps. Thereafter, a seed layer 20 may be formed. The seed layer 20 may be sputter deposited in one embodiment and may be a very thin layer of a metal, such as gold, in one embodiment.

Figure 7:
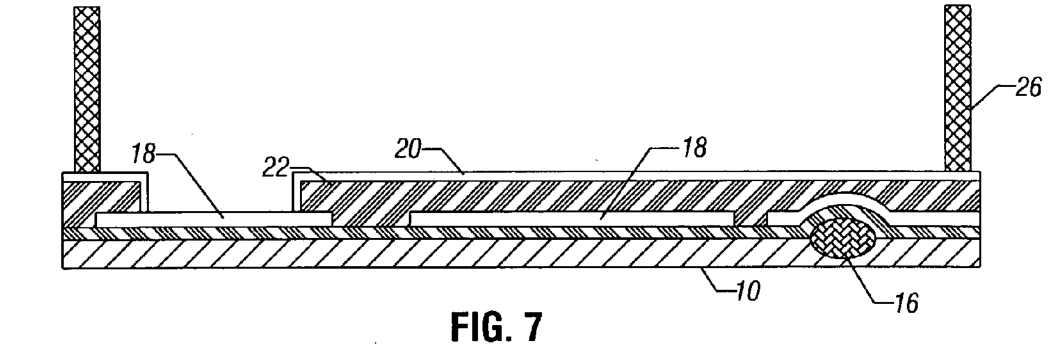
FIG. 7 is an enlarged cross-sectional view corresponding to FIG. 6 at a subsequent stage of manufacture in accordance with one embodiment of the present invention.
Figure 8:
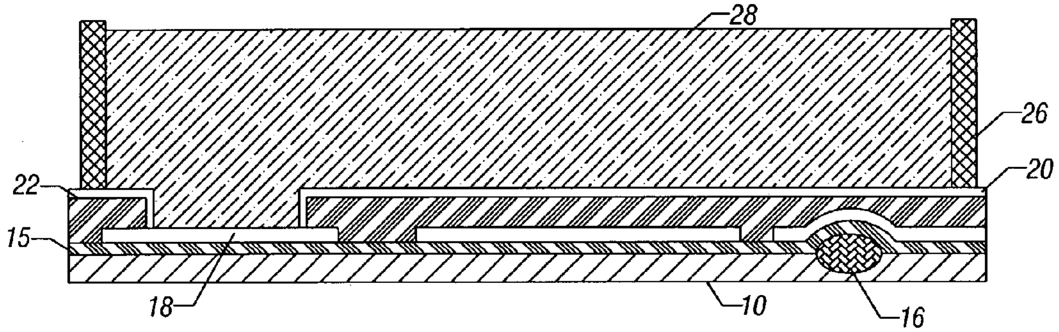
FIG. 8 is an enlarged cross-sectional view corresponding to FIG. 7 at a subsequent stage of manufacture in accordance with one embodiment of the present invention.

Referring to FIG. 7, a mold 26 may be defined for subsequent metal electroplating. Then a metal 28 may be electroplated over the seed layer 22 as shown in FIG. 8. In one embodiment, the metal 28 may also be gold.

Figure 9:
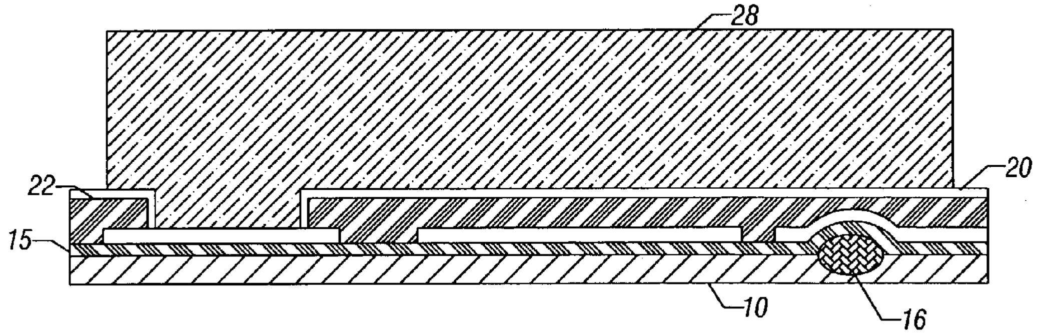
FIG. 9 is an enlarged cross-sectional view corresponding to FIG. 8 at a subsequent stage of manufacture in accordance with one embodiment of the present invention.
Figure 10:
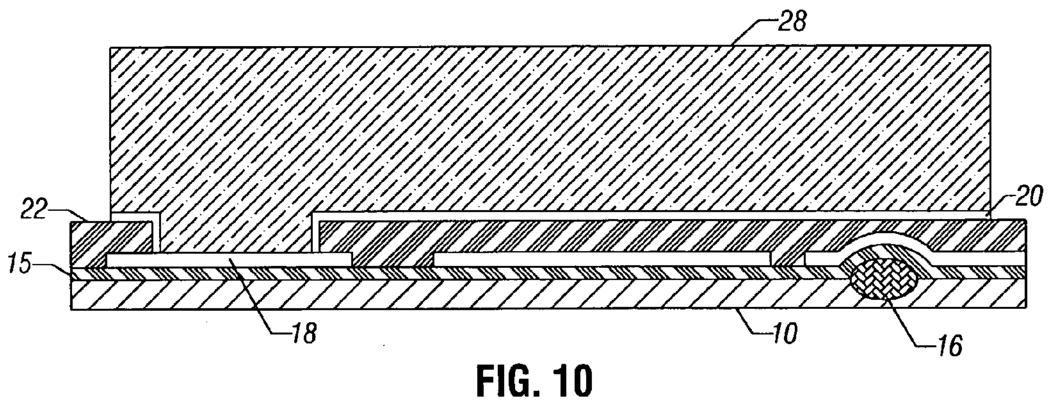
FIG. 10 is an enlarged cross-sectional view corresponding to FIG. 9 at a subsequent stage of manufacture in accordance with one embodiment of the present invention.
Figure 11:
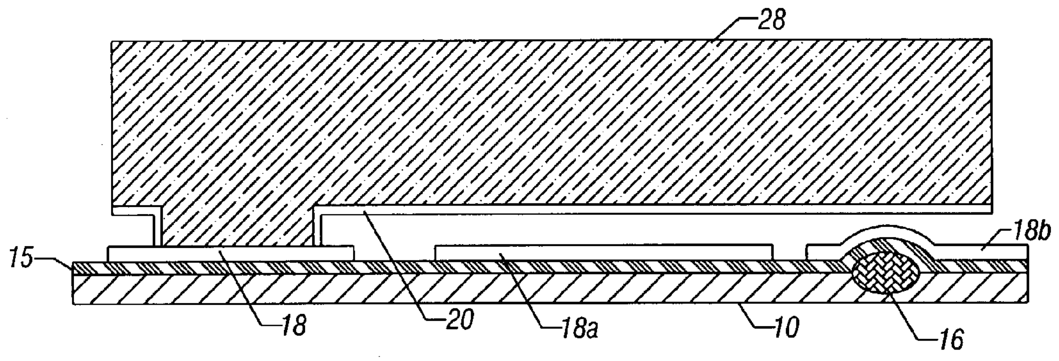
FIG. 11 is an enlarged cross-sectional view corresponding to FIG. 10 at a subsequent stage of manufacture in accordance with one embodiment of the present invention.

Referring to FIG. 9, the mold 26 may be removed. Then, referring to FIG. 10, the exposed portion of the seed layer 20 may be removed. Thereafter, referring to FIG. 11, the layer 22 may be removed. The layer 22 may be removed by heating in one embodiment of the present invention. The layer 22 may be a sacrificial material that breaks down and is removed as a vapor.

Figure 12:
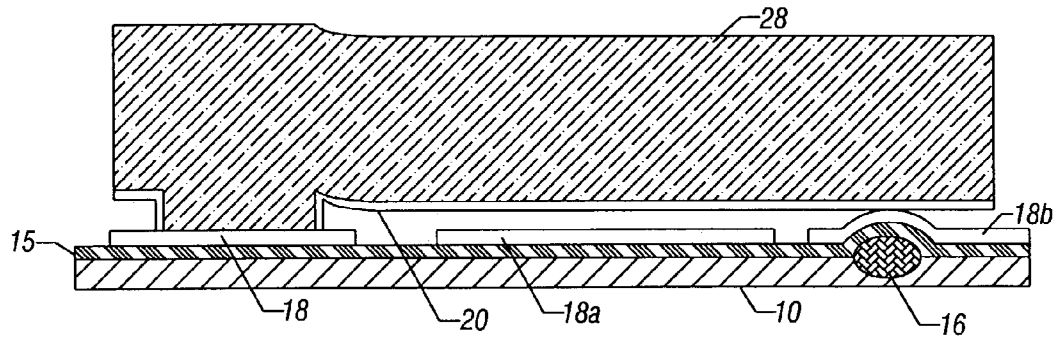
FIG. 12 is an enlarged cross-sectional view corresponding to FIG. 11 with the switch closed.

The remaining portion of the metal 28 may act as a deflectable member. The metal 28 may be deflected towards and away from the substrate 10 in response to an electrostatic force applied by the portion 18*a* to the overlying portion of the seed layer 20. Thus, as shown in FIG. 12, the metal 28 may be deflected so that the seed layer 20 makes electrical contact with the portion 18*b* over the bump 16. Since the seed layer 20 and the portion 18*b* may be conductors, an electrical connection may be made.

While the bump 16 is illustrated as being formed from a field oxide-like technique, the bump oxide 16 may be formed in other ways, including deposition and wet etching. In some embodiments of the present invention, the use of a bump rather than a tip configuration may reduce or eliminate timed etch steps which may result in repeatability problems. One sacrificial layer may be utilized instead of two sacrificial layers in some embodiments. The sacrificial layer release may be simplier since there is only one sacrificial layer in some embodiments. Also, in fabrication facilities that run both complementary metal oxide semiconductor technologies and MEMS technologies, wafer that have gold on them may run in an isolated area. The isolated area may have a limited set of equipment. By moving from the tip to the bump configuration, more activities may be done in the non-isolated fab areas before the wafers are moved to the isolated fab areas. Thus, conventional CMOS equipment may be utilized in MEMS processes.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a microelectromechanical system switch including a cantilevered, deflectable member positioned over a semiconductor substrate, said member having a free end and a fixed end;

forming in said substrate an electrical bump to be electrically contacted by the free end of said member; and forming a portion of said bump of an insulator.

2. The method of claim 1 including using field oxidation techniques to form the portion of said bump of an insulator.

3. The method of claim 1 including covering said insulator with a conductor to form said bump.

4. The method of claim 1 including forming said switch without using timed etch steps.

5. The method of claim 1 including forming said insulator of an oxide.

6. The method of claim 5 including forming the insulator of grown oxide.

7. The method of claim 1 including forming a sacrificial layer between said substrate and said member.

8. The method of claim 7 including forming said switch using only one sacrificial layer.

9. A method comprising:

forming a silicon nitride layer over a semiconductor substrate;

forming an opening in said silicon nitride layer;

oxidizing to form a raised oxide aligned with said opening;

forming a deflectable member over said raised oxide to be deflected towards and away from said raised oxide; and forming a metal layer over said raised oxide to form an electrical contact contactable by said deflectable member.

10. The method of claim 9 including forming an electromechanical system switch between said substrate and said deflectable member.

11. The method of claim 9 including forming said deflectable member without using timed etch steps.

12. The method of claim 9 including forming a sacrificial layer between said substrate and said deflectable member.

13. The method of claim 12 including removing said sacrificial layer to define said deflectable member.

14. The method of claim 13 including using only one sacrificial layer to define said deflectable member.

* * * * *